(12) United States Patent
Matsuo (10) Patent No.: US 9,396,772 B2
(45) Date of Patent: Jul. 19, 2016

(54) DATA TRANSFER CIRCUIT AND DATA TRANSFER METHOD

(71) Applicant: FUJITSU LIMITED, Kawasaki-shi, Kanagawa (JP)

(72) Inventor: Tatsuru Matsuo, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/701,720

(22) Filed: May 1, 2015

(65) Prior Publication Data

US 2016/0027484 A1    Jan. 28, 2016

(30) Foreign Application Priority Data

Jul. 25, 2014   (JP) .................................. 2014-152034

(51) Int. Cl.
| | | |
|---|---|---|
| *G11C 7/10* | (2006.01) | |
| *G11C 5/14* | (2006.01) | |
| *G11C 29/00* | (2006.01) | |
| *G11C 29/44* | (2006.01) | |

(52) U.S. Cl.
CPC ................ *G11C 7/1012* (2013.01); *G11C 5/14* (2013.01); *G11C 29/789* (2013.01); *G11C 2029/4402* (2013.01)

(58) Field of Classification Search
CPC ...... G11C 7/1051; G11C 7/1006; G11C 7/22; G11C 7/06
USPC ...................................... 365/189.17, 189.011
See application file for complete search history.

(56) References Cited

U.S. PATENT DOCUMENTS

| | | | |
|---|---|---|---|
| 2003/0026161 A1* | 2/2003 | Yamaguchi | .......... G11C 7/1006 365/230.03 |
| 2007/0230255 A1 | 10/2007 | Fukuda | |

FOREIGN PATENT DOCUMENTS

| | | |
|---|---|---|
| JP | 2003-109395 | 4/2003 |
| JP | 2007-265557 | 10/2007 |

* cited by examiner

*Primary Examiner* — Huan Hoang
(74) *Attorney, Agent, or Firm* — Fujitsu Patent Center (57) ABSTRACT

A data transfer circuit includes: a first power domain; a nonvolatile memory configured to store first data; a holding circuit; a readout circuit configured to read the first data from the nonvolatile memory and write the first data into the holding circuit at a time of chip reset; and a first controller configured to transfer the first data written into the holding circuit to the first power domain and make the holding circuit keep the first data at the time of chip reset, wherein the readout circuit, at a time of reset of the first power domain after the chip reset, does not read the first data from the nonvolatile memory, and the first controller transfers the first data held in the holding circuit to the first power domain.

19 Claims, 5 Drawing Sheets

DATA TRANSFER CIRCUIT AND DATA TRANSFER METHOD

CROSS-REFERENCE TO RELATED APPLICATION

This application is based upon and claims the benefit of priority of the prior Japanese Patent Application No. 2014-152034, filed on Jul. 25, 2014, the entire contents of which are incorporated herein by reference.

FIELD

The embodiment discussed herein is related to a data transfer circuit and a data transfer method.

BACKGROUND

A semiconductor storage device that operates by using initialization data is provided.

Moreover, a semiconductor integrated circuit provided with at least one functional circuit which is placed on a semiconductor chip and has a predetermined function is provided.

Japanese Laid-open Patent Publication No. 2007-265557 or Japanese Laid-open Patent Publication No. 2003-109395 is an example of related art.

SUMMARY

According to an aspect of the invention, a data transfer circuit includes: a first power domain; a nonvolatile memory configured to store first data; a holding circuit; a readout circuit configured to read the first data from the nonvolatile memory and write the first data into the holding circuit at a time of chip reset; and a first controller configured to transfer the first data written into the holding circuit to the first power domain and make the holding circuit keep the first data at the time of chip reset, wherein the readout circuit, at a time of reset of the first power domain after the chip reset, does not read the first data from the nonvolatile memory, and the first controller transfers the first data held in the holding circuit to the first power domain.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

For example, a latch circuit latches initialization data. A memory cell array has a plurality of memory cells and has a first region and a second region which store data. The buffer circuit has the function of accessing the latch circuit, and transfers the initialization data transferred from the latch circuit to the second region and transfers the initialization data transferred from the second region to the latch circuit.

For instance, a holding circuit holds information used for operation of a functional circuit. A power-supply circuit individually supplies power to the functional circuit and the holding circuit.

A nonvolatile memory stores data even when the power supply is turned off. However, the read rate of the nonvolatile memory is slower than the read rate of a volatile memory and the maximum number of times of being capable of reading from the nonvolatile memory is smaller than the maximum number of times of being capable of reading from the volatile memory. Therefore, the number of times of reading from the nonvolatile memory may be reduced.

Figure 1:
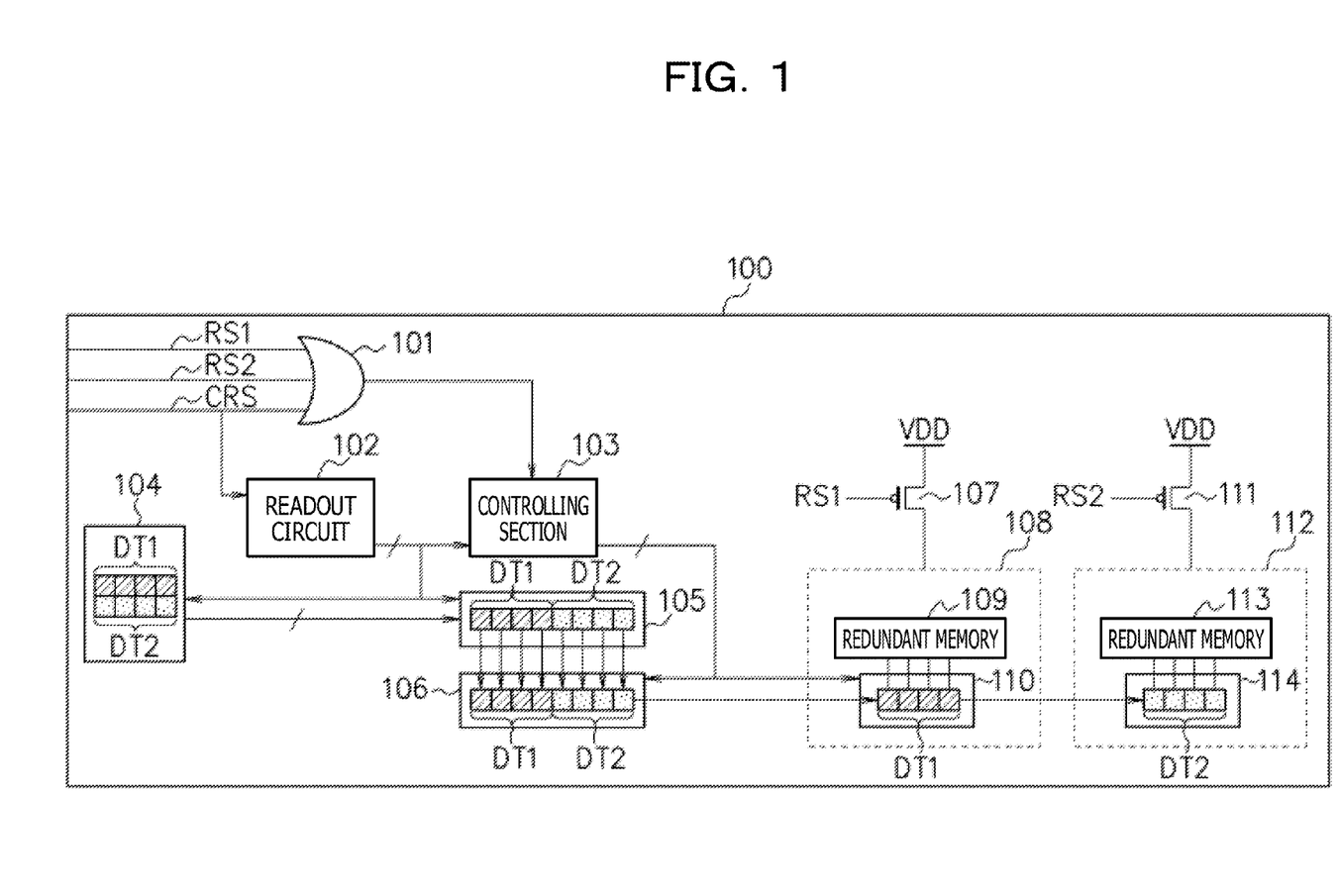
FIG. 1 depicts an example of a data transfer circuit.

FIG. 1 depicts an example of a data transfer circuit. A data transfer circuit 100 may be a semiconductor chip and includes an OR circuit 101, a readout circuit 102, a first controlling section 103, a nonvolatile memory 104, a holding circuit 105, a first shift register 106, a first power switch 107, a first power domain 108, a second power switch 111, and a second power domain 112. The OR circuit 101 outputs an OR signal of a first power domain reset signal RS1, a second power domain reset signal RS2, and a chip reset signal CRS to the first controlling section 103.

The nonvolatile memory 104 may be a fuse memory, for example, and stores first data DT1 and second data DT2. To simplify the explanation, for example, it is assumed that the first data DT1 is formed of four pieces of data and the second data DT2 is also formed of four pieces of data. The holding circuit 105 has, for example, eight flip-flops for holding the first data DT1 and the second data DT2. The first shift register 106 has a plurality of flip-flops that store the first data DT1 and the second data DT2. Under control of the first controlling section 103, the first shift register 106 shifts the first data DT1 and the second data DT2 and outputs the resultant data to the second shift register 110.

The first power switch 107 may be a p-channel field-effect transistor. The source of the first power switch 107 is coupled to a power-supply voltage node VDD, the gate of the first power switch 107 is coupled to a line of the first power domain reset signal RS1, and the drain of the first power switch 107 is coupled to the first power domain 108. The second power switch 111 may be a p-channel field-effect transistor. The source of the second power switch 111 is coupled to the power-supply voltage node VDD, the gate of the second power switch 111 is coupled to a line of the second power domain reset signal RS2, and the drain of the second power switch 111 is coupled to the second power domain 112.

The first power domain 108 has a first redundant memory 109 and a second shift register 110. The second shift register 110 is coupled to a subsequent stage of the first shift register 106. Under control of the first controlling section 103, the second shift register 110 shifts the data input from the first shift register 106 and outputs the resultant data to a third shift register 114.

The second power domain 112 has a second redundant memory 113 and the third shift register 114. The third shift register 114 is coupled to a subsequent stage of the second shift register 110. Under control of the first controlling section 103, the third shift register 114 shifts the data input from the second shift register 110. The second shift register 110 is coupled between the first shift register 106 and the third shift register 114.

The first redundant memory 109 has a plurality of normal memory cells and a plurality of redundant memory cells. If a defective memory cell is found among the plurality of normal memory cells as a result of an inspection, the information on the address of the defective memory cell is stored in the nonvolatile memory 104 as the first data DT1. The first data DT1 in the nonvolatile memory 104 is transferred to the second shift register 110 by a certain transfer method, for example. The first redundant memory 109 replaces the defective normal memory cell with a redundant memory cell based on the first data (defective memory address information) DT1 in the second shift register 110. Therefore, the first redundant memory 109 becomes capable of operating normally.

The second redundant memory 113 has a plurality of normal memory cells and a plurality of redundant memory cells. If a defective memory cell is found among the plurality of normal memory cells as a result of an inspection, the information on the address of the defective memory cell is stored in the nonvolatile memory 104 as the second data DT2. The second data DT2 in the nonvolatile memory 104 is transferred to the third shift register 114 by a certain transfer method, for example. The second redundant memory 113 replaces the defective normal memory cell with a redundant memory cell based on the second data (defective memory address information) DT2 in the third shift register 114. Therefore, the second redundant memory 113 becomes capable of operating normally.

The first data DT1 and the second data DT2 may have information on a defective memory cell address or may have circuit trimming information or the like. The circuit trimming information may be circuit characteristic adjustment information and may contain, for example, information for adjusting a power-supply voltage or timing adjustment information or the like.

Figure 2:
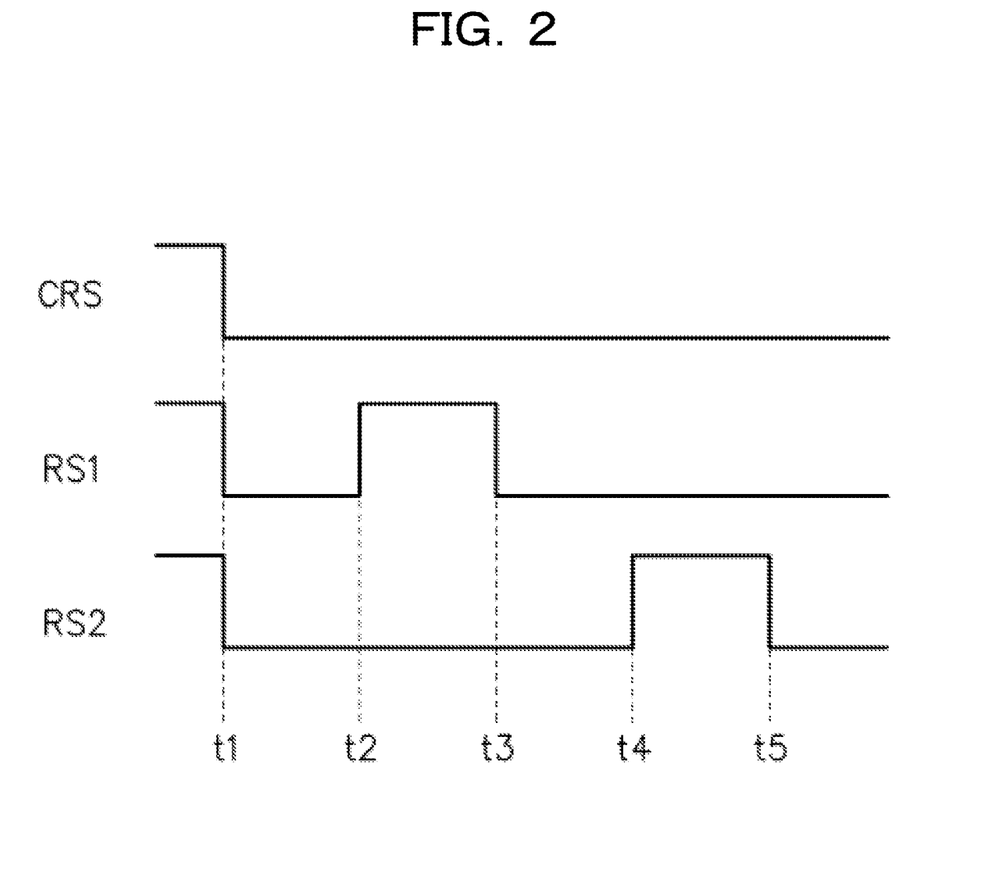
FIG. 2 depicts an example of a signal timing chart.

FIG. 2 depicts an example of a signal timing chart. Signals depicted in FIG. 2 may be the chip reset signal CRS, the first power domain reset signal RS1, and the second power domain reset signal RS2. When the data transfer circuit 100 is turned on, at time t1, the chip reset signal CRS changes from a high level to a low level. The time t1 is a chip reset time, and chip reset processing is performed at time t1.

A period from time t1 to time t2 and after time t3 is a period in which the first power domain 108 is used, and the first power domain reset signal RS1 changes to a low level. In this period, the first power switch 107 is turned on. The first power domain 108 is coupled to the power-supply voltage node VDD and becomes operable as a result of being supplied with a power-supply voltage.

A period from time t2 to time t3 is a period in which the first power domain 108 is not used, and the first power domain reset signal RS1 changes to a high level. In this period, the first power switch 107 is turned off. The first power domain 108 is disconnected from the power-supply voltage node VDD and becomes inoperable as a result of being supplied with no power-supply voltage. Thus, in the first power domain 108, power consumption by a leakage current may be reduced.

Likewise, a period from time t1 to time t4 and after time t5 is a period in which the second power domain 112 is used, and the second power domain reset signal RS2 changes to a low level. In this period, the second power switch 111 is turned on. The second power domain 112 is coupled to the power-supply voltage node VDD and becomes operable as a result of being supplied with the power-supply voltage.

A period from time t4 to time t5 is a period in which the second power domain 112 is not used, and the second power domain reset signal RS2 changes to a high level. In this period, the second power switch 111 is turned off. The second power domain 112 is disconnected from the power-supply voltage node VDD and becomes inoperable as a result of being supplied with no power-supply voltage. Thus, in the second power domain 112, power consumption by a leakage current may be reduced.

At time t1, the chip reset signal CRS changes from a high level to a low level and chip reset is performed. At time t1, in addition to the chip reset signal CRS, the first power domain reset signal RS1 and the second power domain reset signal RS2 also change from a high level to a low level. The OR circuit 101 outputs the same signal as the chip reset signal CRS to the first controlling section 103.

When the chip reset signal CRS falls from a high level to a low level, the readout circuit 102 reads the first data DT1 from a first address of the nonvolatile memory 104, writes the first data DT1 into the holding circuit 105, reads the second data DT2 from a second address of the nonvolatile memory 104, and writes the second data DT2 into the holding circuit 105.

When the output signal of the OR circuit 101 falls from a high level to a low level, the first controlling section 103 writes the first data DT1 and the second data DT2 which are held in the holding circuit 105 into the first shift register 106. At this time, the holding circuit 105 holds the first data DT1 and the second data DT2.

Next, the first controlling section 103 makes the second shift register 110 store the first data DT1 and makes the third shift register 114 store the second data DT2 by making the first shift register 106, the second shift register 110, and the third shift register 114 shift the data thereof.

For example, the first shift register 106, the second shift register 110, and the third shift register 114 shift the data in synchronization with a clock signal. When the first shift register 106, the second shift register 110, and the third shift register 114 shift four pieces of data in synchronization with four clocks, the first shift register 106 outputs four pieces of second data DT2 to the second shift register 110 and the second shift register 110 stores the four pieces of second data DT2. Then, when the first shift register 106, the second shift register 110, and the third shift register 114 shift four pieces of data in synchronization with four clocks, the third shift register 114 stores the four pieces of second data DT2 input from the second shift register 110 and the second shift register 110 stores four pieces of first data DT1 input from the first shift register 106.

The first redundant memory 109 replaces a defective normal memory cell with a redundant memory cell based on the first data DT1 in the second shift register 110, for example, the defective memory address information. Therefore, the first redundant memory 109 becomes capable of operating normally.

The second redundant memory 113 replaces a defective normal memory cell with a redundant memory cell based on the second data DT2 in the third shift register 114, for example, the defective memory address information. Therefore, the second redundant memory 113 becomes capable of operating normally.

At time t2, the first power domain reset signal RS1 changes from a low level to a high level. The first power switch 107 is turned off, and the first power domain 108 is disconnected from the power-supply voltage node VDD, stops being supplied with the power-supply voltage, and enters a nonoperating state. Since the second shift register 110 is a volatile memory, for example, a flip-flop, the first data DT1 is deleted from the second shift register 110.

At time t3, the first power domain reset signal RS1 changes from a high level to a low level and the first power domain 108 is reset. The first power switch 107 is turned on, and the first power domain 108 is coupled to the power-supply voltage node VDD, is supplied with the power-supply voltage, and enters an operable state. The second shift register 110 may store the first data DT1 again in order to put the first redundant memory 109 into a normally operable state.

The first data DT1 may be transferred to the second shift register 110 from the nonvolatile memory 104 by the same operation as the operation performed at time t1. For example, the nonvolatile memory 104 may be a fuse memory and the holding circuit 105 may be a flip-flop volatile memory. The read rate of the nonvolatile memory 104 is slower than the read rate of the holding circuit 105. The readout circuit 102 performs, on the nonvolatile memory 104, reading of the first data D1 from the first address in a first cycle and reading of the second data DT2 from the second address in a second cycle. Thus, as the number of power domains 108 and 112 is increased, the number of pieces of first and second data DT1 and DT2 is increased, the number of read cycles is increased, and the read time is lengthened. The time of one cycle of the nonvolatile memory 104 is 5 to 10 times longer than the time of one cycle of the holding circuit 105. Therefore, when the power domain 108 is reset, the rate at which the first data DT1 is transferred to the second shift register 110 from the nonvolatile memory 104 may be increased.

The maximum number of times of being capable of reading from the nonvolatile memory (the fuse memory) 104 may be a finite value $10^6$ to $10^7$. Therefore, if the reset of the power domain 108 or 112 is frequently performed, the number of times of readout from the nonvolatile memory 104 exceeds the maximum number of times readout of being capable of reading, whereby correct first and second data DT1 and DT2 may not be read from the nonvolatile memory 104. For example, to suppress a reduction in the longevity of the data transfer circuit 100, the number of times of readout from the nonvolatile memory 104 may be reduced.

At time t3, the following processing is performed. At time t3, the OR circuit 101 outputs a signal which is substantially identical to the first power domain reset signal RS1 to the first controlling section 103. Since the chip reset signal CRS maintains a low level, the readout circuit 102 may not perform readout from the nonvolatile memory 104. At this time, the holding circuit 105 still holds the first data DT1 and the second data DT2. Since data shift was performed at time t1, the first data DT1 and the second data DT2 are deleted from the first shift register 106.

When the output signal of the OR circuit 101 falls from a high level to a low level, the first controlling section 103 writes the first data DT1 and the second data DT2 which are held in the holding circuit 105 into the first shift register 106. Next, as is the case with the operation performed at time t1, the first controlling section 103 makes the second shift register 110 store the first data DT1 and makes the third shift register 114 store the second data DT2 by making the first shift register 106, the second shift register 110, and the third shift register 114 shift the data thereof.

The first redundant memory 109 replaces a defective normal memory cell with a redundant memory cell based on the first data DT1 in the second shift register 110, for example, the defective memory address information. Therefore, the first redundant memory 109 becomes capable of operating normally.

At time t4, the second power domain reset signal RS2 changes from a low level to a high level. The second power switch 111 is turned off. The second power domain 112 is disconnected from the power-supply voltage node VDD, stops being supplied with the power-supply voltage, and enters a nonoperating state. Since the third shift register 114 is a volatile memory, the second data DT2 is deleted from the third shift register 114.

At time t5, the second power domain reset signal RS2 changes from a high level to a low level and the second power domain 112 is reset. The second power switch 111 is turned on. The second power domain 112 is coupled to the power-supply voltage node VDD, is supplied with the power-supply voltage, and enters an operable state. The second data DT2 may be stored again in the third shift register 114 in order to put the second redundant memory 113 into a normally operable state.

At time t5, the OR circuit 101 outputs a signal which is substantially identical to the second power domain reset signal RS2 to the first controlling section 103. Since the chip reset signal CRS maintains a low level, the readout circuit 102 does not perform readout from the nonvolatile memory 104. At this time, the holding circuit 105 still holds the first data DT1 and the second data DT2.

When the output signal of the OR circuit 101 falls from a high level to a low level, the first controlling section 103 writes the first data DT1 and the second data DT2 which are held in the holding circuit 105 into the first shift register 106. Next, as is the case with the operation performed at time t1, the first controlling section 103 makes the second shift register 110 store the first data DT1 and the third shift register 114 store the second data DT2 by making the first shift register 106, the second shift register 110, and the third shift register 114 shift the data thereof.

The second redundant memory 113 replaces a defective normal memory cell with a redundant memory cell based on the second data DT2 in the third shift register 114, for example, the defective memory address information. Therefore, the second redundant memory 113 becomes capable of operating normally.

At the time of reset of the first power domain 108 at time t3 and at the time of reset of the second power domain 112 at time t5, readout from the nonvolatile memory 104 is not performed and the first data DT1 and the second data DT2 which are held in the holding circuit 105 are transferred to the second shift register 110 and the third shift register 114, respectively. Since readout from the nonvolatile memory 104 is not performed, the transfer rate of the first and second data DT1 and DT2 may be increased. Readout from the nonvolatile memory 104 may be performed only at time t1 and may not be performed at time t3 and time t5. Therefore, the number of times of readout from the nonvolatile memory 104 is reduced, which may lengthen the longevity of the data transfer circuit 100.

Figure 3:
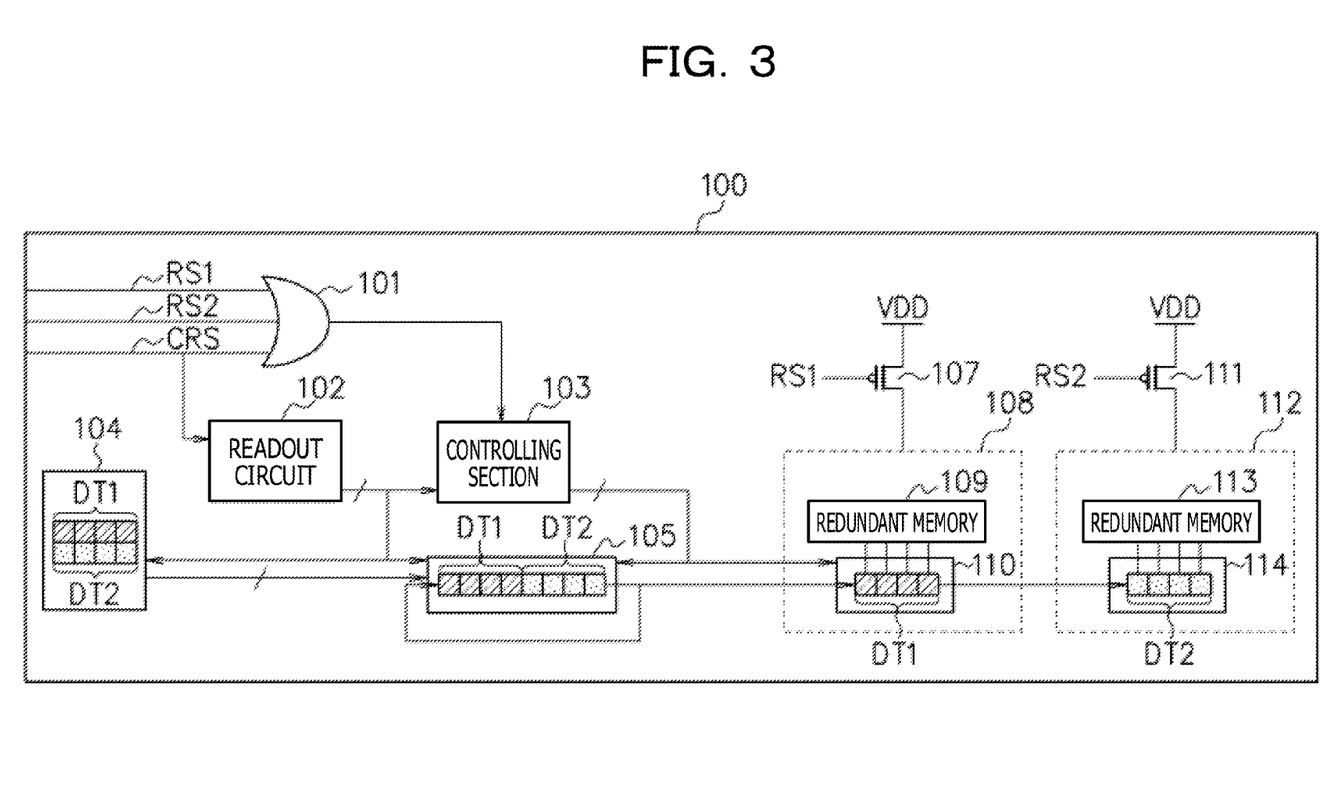
FIG. 3 depicts an example of a data transfer circuit.

FIG. 3 depicts an example of a data transfer circuit. A data transfer circuit 100 depicted in FIG. 3 may have a configuration obtained by removing the first shift register 106 from the data transfer circuit 100 depicted in FIG. 1. Therefore, the configuration which is different from the configuration depicted in FIG. 1 may be described.

A holding circuit 105 of FIG. 3 may have the functions of both the holding circuit 105 and the first shift register 106 of FIG. 1. The holding circuit 105 of FIG. 3 has a first shift register for holding the first data DT1 and the second data DT2, for example, a flip-flop. An output terminal of the first shift register provided in the holding circuit 105 is coupled to an input terminal of the first shift register provided in the holding circuit 105. The second shift register 110 is coupled between the first shift register provided in the holding circuit 105 and the third shift register 114.

At time t1, when the chip reset signal CRS falls from a high level to a low level, the readout circuit 102 reads the first data DT1 from the first address of the nonvolatile memory 104. The first data DT1 is written into the first shift register provided in the holding circuit 105, the second data DT2 is read from the second address of the nonvolatile memory 104, and the second data DT2 is written into the first shift register provided in the holding circuit 105.

When the output signal of the OR circuit 101 falls from a high level to a low level, the first controlling section 103 makes the second shift register 110 store the first data DT1 and the third shift register 114 store the second data DT2 by making the first shift register provided in the holding circuit 105, the second shift register 110, and the third shift register 114 shift the data thereof. At this time, the output data of the first shift register provided in the holding circuit 105 is fed back as the input data of the first shift register provided in the holding circuit 105. Therefore, the first shift register provided in the holding circuit 105 holds the first data DT1 and the second data DT2 after the data shift.

At time t3, since the chip reset signal CRS maintains a low level, the readout circuit 102 does not perform readout from the nonvolatile memory 104. When the output signal of the OR circuit 101 falls from a high level to a low level, the first controlling section 103 makes the second shift register 110 store the first data DT1 and the third shift register 114 store the second data DT2 by making the first shift register provided in the holding circuit 105, the second shift register 110, and the third shift register 114 shift the data thereof. At this time, the output data of the first shift register provided in the holding circuit 105 is fed back as the input data of the first shift register provided in the holding circuit 105. Therefore, the first shift register provided in the holding circuit 105 holds the first data DT1 and the second data DT2 after the data shift.

At time t5, since the chip reset signal CRS maintains a low level, the readout circuit 102 does not perform readout from the nonvolatile memory 104. When the output signal of the OR circuit 101 falls from a high level to a low level, the first controlling section 103 makes the second shift register 110 store the first data DT1 and the third shift register 114 store the second data DT2 by making the first shift register provided in the holding circuit 105, the second shift register 110, and the third shift register 114 shift the data thereof. At this time, the output data of the first shift register provided in the holding circuit 105 is fed back as the input data of the first shift register provided in the holding circuit 105. Therefore, the first shift register provided in the holding circuit 105 holds the first data DT1 and the second data DT2 after the data shift.

Figure 4:
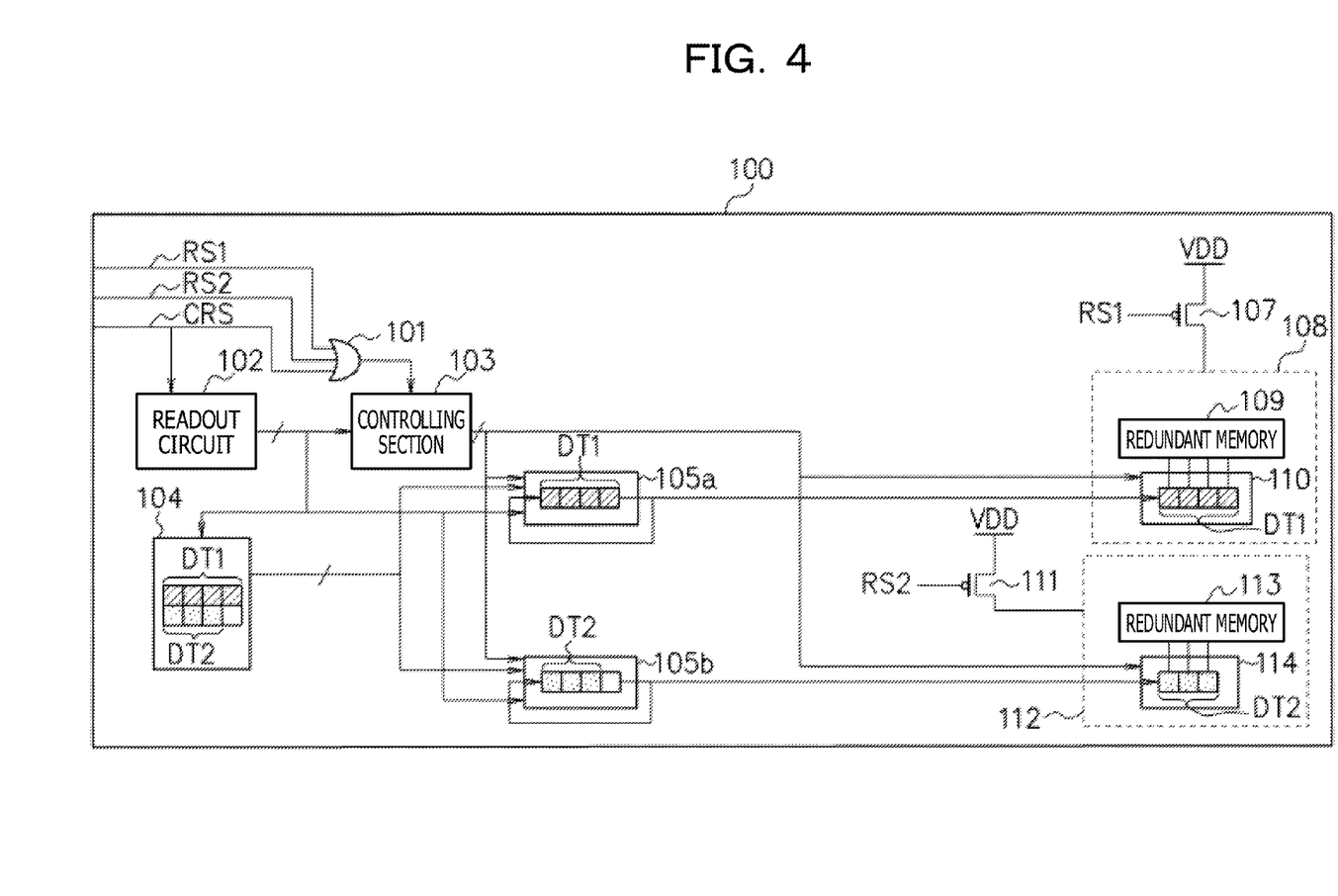
FIG. 4 depicts an example of a data transfer circuit.

FIG. 4 depicts an example of a data transfer circuit. A data transfer circuit 100 depicted in FIG. 4 may have a configuration in which a first holding circuit 105a and a second holding circuit 105b are provided in place of the holding circuit 105 in the data transfer circuit 100 depicted in FIG. 3. Therefore, the configuration which is different from the configuration depicted in FIG. 3 may be described.

The first holding circuit 105a has a fourth shift register for holding the first data DT1, for example, a flip-flop. The second holding circuit 105b has a fifth shift register for holding the second data DT2, for example, a flip-flop. For instance, the first data DT1 may be four pieces of data, the second data DT2 may be three pieces of data, and the first data DT1 and the second data DT2 may have different data lengths. Also in that case, the length of the fifth shift register provided in the second holding circuit 105b may be the length of four pieces of data and may be equal to the length of the fourth shift register provided in the first holding circuit 105a.

An output terminal of the fourth shift register provided in the first holding circuit 105a is coupled to an input terminal of the fourth shift register provided in the first holding circuit 105a. An output terminal of the fifth shift register provided in the second holding circuit 105b is coupled to an input terminal of the fifth shift register provided in the second holding circuit 105b. The second shift register 110 is coupled to a subsequent stage of the fourth shift register provided in the first holding circuit 105a. The third shift register 114 is coupled to a subsequent stage of the fifth shift register provided in the second holding circuit 105b.

At time t1, when the chip reset signal CRS falls from a high level to a low level, the readout circuit 102 reads the first data DT1 from the first address of the nonvolatile memory 104. The first data DT1 is written into the fourth shift register provided in the first holding circuit 105a, the second data DT2 is read from the second address of the nonvolatile memory 104, and the second data DT2 is written into the fifth shift register provided in the second holding circuit 105b. The three pieces of second data DT2 may be written into an end portion of the fifth shift register provided in the second holding circuit 105b.

When the output signal of the OR circuit 101 falls from a high level to a low level, the first controlling section 103 makes the fourth shift register provided in the first holding circuit 105a, the second shift register 110, the fifth shift register provided in the second holding circuit 105b, and the third shift register 114 shift data thereof by four pieces. Therefore, the second shift register 110 stores the first data DT1 input from the fourth shift register provided in the first holding circuit 105a. The third shift register 114 stores the second data DT2 input from the fifth shift register provided in the second holding circuit 105b.

At this time, the output data of the fourth shift register provided in the first holding circuit 105a is fed back as the input data of the fourth shift register provided in the first holding circuit 105a. Therefore, the fourth shift register provided in the first holding circuit 105a holds the first data DT1 after the data shift. Likewise, the output data of the fifth shift register provided in the second holding circuit 105b is fed back as the input data of the fifth shift register provided in the second holding circuit 105b. Therefore, the fifth shift register provided in the second holding circuit 105b holds the second data DT2 after the data shift.

In FIG. 4, the first and second data DT1 and DT2 are transferred to the shift registers 110 and 114 from the holding circuits 105a and 105b, respectively, in 4 cycles. In FIG. 1 or FIG. 3, the first and second data DT1 and DT2 are transferred to the shift registers 110 and 114 from the holding circuit 105 in 8 cycles. Therefore, the data transfer time may be shortened.

At time t3, since the chip reset signal CRS maintains a low level, the readout circuit 102 does not perform readout from the nonvolatile memory 104. When the output signal of the OR circuit 101 falls from a high level to a low level, the first controlling section 103 makes the fourth shift register provided in the first holding circuit 105a, the second shift register 110, the fifth shift register provided in the second holding circuit 105b, and the third shift register 114 shift data thereof by four pieces. Therefore, the second shift register 110 stores the first data DT1 input from the fourth shift register provided in the first holding circuit 105a. The third shift register 114 stores the second data DT2 input from the fifth shift register provided in the second holding circuit 105b.

At this time, the output data of the fourth shift register provided in the first holding circuit 105a is fed back as the input data of the fourth shift register provided in the first holding circuit 105a. Therefore, the fourth shift register provided in the first holding circuit 105a holds the first data DT1 after the data shift. Likewise, the output data of the fifth shift register provided in the second holding circuit 105b is fed back as the input data of the fifth shift register provided in the second holding circuit 105*b*. Therefore, the fifth shift register provided in the second holding circuit 105*b* holds the second data DT2 after the data shift.

For example, also at time t3, as is the case with time t1, in the data transfer circuit 100 depicted in FIG. 4, the data transfer time may be shortened.

At time t5, since the chip reset signal CRS maintains a low level, the readout circuit 102 does not perform readout from the nonvolatile memory 104. When the output signal of the OR circuit 101 falls from a high level to a low level, the first controlling section 103 makes the fourth shift register provided in the first holding circuit 105*a*, the second shift register 110, the fifth shift register provided in the second holding circuit 105*b*, and the third shift register 114 shift data thereof by four pieces. Therefore, the second shift register 110 stores the first data DT1 input from the fourth shift register provided in the first holding circuit 105*a*. The third shift register 114 stores the second data DT2 input from the fifth shift register provided in the second holding circuit 105*b*.

At this time, the output data of the fourth shift register provided in the first holding circuit 105*a* is fed back as the input data of the fourth shift register provided in the first holding circuit 105*a*. Therefore, the fourth shift register provided in the first holding circuit 105*a* holds the first data DT1 after the data shift. Likewise, the output data of the fifth shift register provided in the second holding circuit 105*b* is fed back as the input data of the fifth shift register provided in the second holding circuit 105*b*. Therefore, the fifth shift register provided in the second holding circuit 105*b* holds the second data DT2 after the data shift.

Also at time t5, as is the case with time t1, in the data transfer circuit 100 depicted in FIG. 4, the data transfer time may be shortened.

Figure 5:
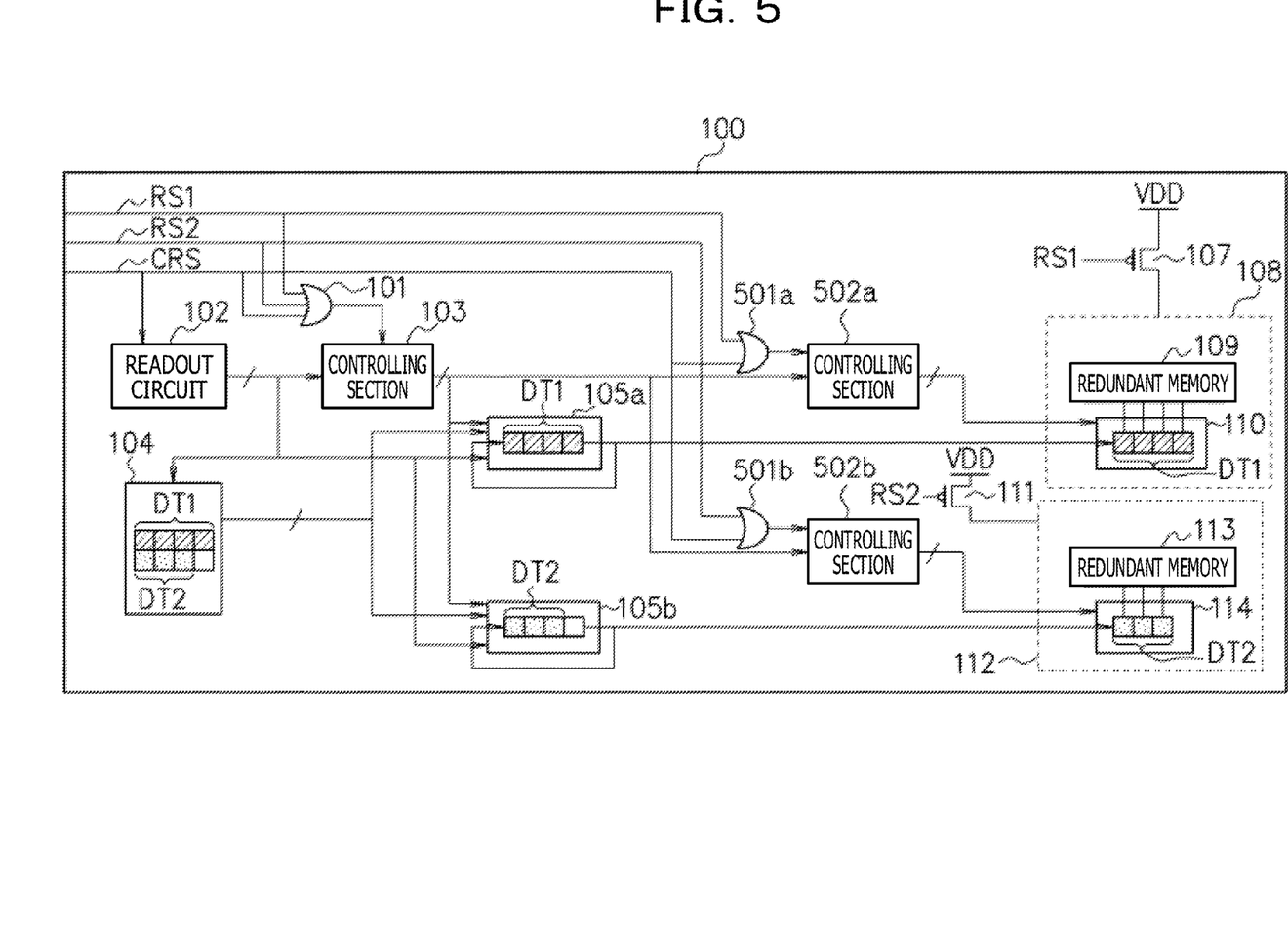
FIG. 5 depicts an example of a data transfer circuit.

FIG. 5 depicts an example of a data transfer circuit. A data transfer circuit 100 depicted in FIG. 5 may have a configuration obtained by adding OR circuits 501*a* and 501*b*, a second controlling section 502*a*, and a third controlling section 502*b* to the data transfer circuit 100 depicted in FIG. 4. Therefore, the configuration which is different from the configuration depicted in FIG. 4 may be described.

The OR circuit 501*a* outputs an OR signal of the first power domain reset signal RS1 and the chip reset signal CRS to the second controlling section 502*a*. The second controlling section 502*a* controls the data shift of the second shift register 110. The OR circuit 501*b* outputs an OR signal of the second power domain reset signal RS2 and the chip reset signal CRS to the third controlling section 502*b*. The third controlling section 502*b* controls the data shift of the third shift register 114. The first controlling section 103 controls the data shift of the fourth shift register provided in the first holding circuit 105*a* and the fifth shift register provided in the second holding circuit 105*b*.

At time t1, when the chip reset signal CRS falls from a high level to a low level, the readout circuit 102 reads the first data DT1 from the first address of the nonvolatile memory 104. The first data DT1 is written into the fourth shift register provided in the first holding circuit 105*a*, the second data DT2 is read from the second address of the nonvolatile memory 104, and the second data DT2 is written into the fifth shift register provided in the second holding circuit 105*b*.

When the output signal of the OR circuit 101 falls from a high level to a low level, the first controlling section 103 makes the fourth shift register provided in the first holding circuit 105*a* and the fifth shift register provided in the second holding circuit 105*b* shift data thereof by four pieces. Therefore, the fourth shift register provided in the first holding circuit 105*a* outputs the first data DT1 to the second shift register 110, and the fifth shift register provided in the second holding circuit 105*b* outputs the second data DT2 to the third shift register 114. At this time, the fourth shift register provided in the first holding circuit 105*a* holds the first data DT1 after the data shift. Likewise, the fifth shift register provided in the second holding circuit 105*b* holds the second data DT2 after the data shift.

The OR circuits 501*a* and 501*b* each output a signal which is substantially identical to the chip reset signal CRS. When the output signal of the OR circuit 501*a* falls from a high level to a low level, the second controlling section 502*a* makes the second shift register 110 shift data thereof by four pieces. Therefore, the second shift register 110 stores the first data DT1 input from the fourth shift register provided in the first holding circuit 105*a*.

When the output signal of the OR circuit 501*b* falls from a high level to a low level, the third controlling section 502*b* makes the third shift register 114 shift data thereof by four pieces. Therefore, the third shift register 114 stores the second data DT2 input from the fifth shift register provided in the second holding circuit 105*b*.

At time t3, since the chip reset signal CRS maintains a low level, the readout circuit 102 does not perform readout from the nonvolatile memory 104. When the output signal of the OR circuit 101 falls from a high level to a low level, the first controlling section 103 makes the fourth shift register provided in the first holding circuit 105*a* and the fifth shift register provided in the second holding circuit 105*b* shift data thereof by four pieces. Therefore, the fourth shift register provided in the first holding circuit 105*a* outputs the first data DT1 to the second shift register 110, and the fifth shift register provided in the second holding circuit 105*b* outputs the second data DT2 to the third shift register 114. At this time, the fourth shift register provided in the first holding circuit 105*a* holds the first data DT1 after the data shift. Likewise, the fifth shift register provided in the second holding circuit 105*b* holds the second data DT2 after the data shift.

The OR circuit 501*a* outputs a signal which is substantially identical to the first power domain reset signal RS1. When the output signal of the OR circuit 501*a* falls from a high level to a low level, the second controlling section 502*a* makes the second shift register 110 shift data thereof by four pieces. Therefore, the second shift register 110 stores the first data DT1 input from the fourth shift register provided in the first holding circuit 105*a*.

Since the OR circuit 501*b* maintains the low-level output, the third controlling section 502*b* does not perform the data shift of the third shift register 114. Therefore, the second data DT2 in the third shift register 114 does not change.

At time t3, since the first power domain 108 is reset and the first data DT1 of the second shift register 110 provided in the first power domain 108 is erased, the first data DT1 may be transferred again to the second shift register 110. Since the second power domain 112 is not reset and the second data DT2 of the third shift register 114 provided in the second power domain 112 is not erased, the second data DT2 may not be transferred again to the third shift register 114.

In the data transfer circuits 100 depicted in FIGS. 1, 3, and 4, at time t3, since the second data DT2 in the third shift register 114 changes due to the data shift by the third shift register 114 during the operation of the second power domain 112, the second redundant memory 113 may be affected.

In the data transfer circuit 100 depicted in FIG. 5, at time t3, the first data DT1 may be transferred only to the second shift register 110 and the second data DT2 does not have to be transferred to the third shift register 114. Since the third shift register 114 does not perform data shift, the second data DT2 in the third shift register 114 does not change. Therefore, the second redundant memory 113 may not be affected.

At time t5, since the chip reset signal CRS maintains a low level, the readout circuit 102 does not perform readout from the nonvolatile memory 104. When the output signal of the OR circuit 101 falls from a high level to a low level, the first controlling section 103 makes the fourth shift register provided in the first holding circuit 105a and the fifth shift register provided in the second holding circuit 105b shift data thereof by four pieces. Therefore, the fourth shift register provided in the first holding circuit 105a outputs the first data DT1 to the second shift register 110, and the fifth shift register provided in the second holding circuit 105b outputs the second data DT2 to the third shift register 114. At this time, the fourth shift register provided in the first holding circuit 105a holds the first data DT1 after the data shift. Likewise, the fifth shift register provided in the second holding circuit 105b holds the second data DT2 after the data shift.

The OR circuit 501b outputs a signal which is substantially identical to the second power domain reset signal RS2. When the output signal of the OR circuit 501b falls from a high level to a low level, the third controlling section 502b makes the third shift register 114 shift data thereof by four pieces. Therefore, the third shift register 114 stores the second data DT2 input from the fifth shift register provided in the second holding circuit 105b.

Since the OR circuit 501a maintains the low-level output, the second controlling section 502a does not perform the data shift of the second shift register 110. Therefore, the first data DT1 in the second shift register 110 does not change.

In the data transfer circuits 100 depicted in FIGS. 1, 3, and 4, at time t5, since the first data DT1 in the second shift register 110 changes due to the data shift by the second shift register 110 during the operation of the first power domain 108, the first redundant memory 109 may be affected.

In the data transfer circuit 100 depicted in FIG. 5, at time t5, the second data DT2 may be transferred only to the third shift register 114 and the first data DT1 does not have to be transferred to the second shift register 110. Since the second shift register 110 does not perform data shift, the first data DT1 in the second shift register 110 may not change. Therefore, the first redundant memory 109 may not be affected.

As described above, in the data transfer circuits 100 depicted in FIGS. 1, 3, 4, and 5, at the time of chip reset at time t1, the first controlling section 103 transfers the first data DT1 and the second data DT2 which are written into the holding circuits 105, 105a, and 105b to the first power domain 108 and the second power domain 112, respectively, and makes the first power domain 108 and the second power domain 112 respectively hold the first data DT1 and the second data DT2 which are written into the holding circuits 105, 105a, and 105b.

At the time of reset of the first power domain 108 at time t3 after chip reset at time t1 or at the time of reset of the second power domain 112 at time t5 after chip reset at time t1, the readout circuit 102 does not read the first data DT1 and the second data DT2 from the nonvolatile memory 104. The first controlling section 103 transfers the first data DT1 and the second data DT2 which are held in the holding circuits 105, 105a, and 105b to the first power domain 108 and the second power domain 112, respectively.

Since readout from the nonvolatile memory 104 is not performed at the time of reset of the first power domain 108 and at the time of reset of the second power domain 112, the number of times of readout from the nonvolatile memory 104 may be reduced. Therefore, the data transfer rate may be increased and the longevity of the data transfer circuit 100 may be lengthened.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A data transfer circuit comprising:
    a first power domain;
    a nonvolatile memory configured to store first data;
    a holding circuit;
    a readout circuit configured to read the first data from the nonvolatile memory and write the first data into the holding circuit at a time of chip reset; and
    a first controller configured to transfer the first data written into the holding circuit to the first power domain and make the holding circuit keep the first data at the time of chip reset, wherein
    the readout circuit, at a time of reset of the first power domain after the chip reset, does not read the first data from the nonvolatile memory, and the first controller transfers the first data held in the holding circuit to the first power domain.

2. The data transfer circuit according to claim 1, further comprising:
    a first power switch, coupled between the first power domain and a power-supply voltage node, configured to switch from an off-state to an on-state after the chip reset.

3. The data transfer circuit according to claim 2, wherein the readout circuit, when the first power switch is switched from the off-state to the on-state, does not read the first data from the nonvolatile memory, and the first controller transfers the first data held in the holding circuit to the first power domain.

4. The data transfer circuit according to claim 1, further comprising:
    a second power domain, wherein
    the nonvolatile memory stores second data in addition to the first data, and,
    at the time of chip reset, the readout circuit reads the first data and the second data from the nonvolatile memory and writes the first data and second data into the holding circuit, and the first controller transfers the first data written into the holding circuit to the first power domain, transfers the second data written into the holding circuit to the second power domain, and makes the holding circuit keep the first data and the second data.

5. The data transfer circuit according to claim 4, wherein the readout circuit, after the chip reset and at a time of reset of the first power domain or at a time of reset of the second power domain, does not read the first data and the second data from the nonvolatile memory, and the first controller transfers the first data held in the holding circuit to the first power domain and transfers the second data held in the holding circuit to the second power domain.

6. The data transfer circuit according to claim 4, further comprising:
a first power switch, coupled between the first power domain and a power-supply voltage node, configured to switch from an off-state to an on-state after the chip reset; and
a second power switch, coupled between the second power domain and the power-supply voltage node, configured to switch from the off-state to the on-state after the chip reset.

7. The data transfer circuit according to claim 6, wherein the readout circuit, when the first power switch is switched from the off-state to the on-state or when the second power switch is switched from the off-state to the on-state, does not read the first data and the second data from the nonvolatile memory, and the first controller transfers the first data held in the holding circuit to the first power domain and transfers the second data held in the holding circuit to the second power domain.

8. The data transfer circuit according to claim 4, further comprising:
a first shift register configured to hold the first data and the second data.

9. The data transfer circuit according to claim 8, wherein the first power domain includes a second shift register, the second power domain includes a third shift register, and the second shift register is coupled between the first shift register and the third shift register.

10. The data transfer circuit according to claim 9, wherein the first controller writes the first data and the second data which are held in the holding circuit into the first shift register and makes the second shift register store the first data and the third shift register store the second data by shift operations of the first shift register, the second shift register, and the third shift register.

11. The data transfer circuit according to claim 4, wherein an output terminal of the first shift register is coupled to an input terminal of the first shift register,
the first power domain includes a second shift register,
the second power domain includes a third shift register, and
the second shift register is coupled between the first shift register and the third shift register.

12. The data transfer circuit according to claim 11, wherein the first controller makes the second shift register store the first data and the third shift register store the second data by shift operations of the first shift register, the second shift register, and the third shift register.

13. The data transfer circuit according to claim 4, wherein the first power domain includes a second shift register,
the second power domain includes a third shift register,
the holding circuit includes a fourth shift register configured to hold the first data and a fifth shift register configured to hold the second data,
an output terminal of the fourth shift register is coupled to an input terminal of the fourth shift register,
an output terminal of the fifth shift register is coupled to an input terminal of the fifth shift register,
a length of the fifth shift register is equal to a length of the fourth shift register,
the second shift register is coupled to the fourth shift register, and
the third shift register is coupled to the fifth shift register.

14. The data transfer circuit according to claim 13, wherein the first controller makes the second shift register store the first data by shift operations of the fourth shift register and the second shift register and makes the third shift register store the second data by shift operations of the fifth shift register and the third shift register.

15. The data transfer circuit according to claim 13, wherein the first controller makes the second shift register output the first data held in the fourth shift register by a shift operation of the fourth shift register and makes the third shift register output the second data held in the fifth shift register by a shift operation of the fifth shift register, and
the data transfer circuit further includes:
a second controller configured to make the second shift register store the first data output from the fourth shift register by a shift operation of the second shift register at the time of chip reset or at the time of reset of the first power domain, and
a third controller configured to make the third shift register store the second data output from the fifth shift register by a shift operation of the third shift register at the time of chip reset or at the time of reset of the second power domain.

16. The data transfer circuit according to claim 1, wherein the holding circuit includes a flip-flop to hold the first data.

17. A data transfer method comprising:
reading first data from a nonvolatile memory and write the first data into a holding circuit at a time of chip reset;
transferring, by a controller, the first data written into the holding circuit to a first power domain while keeping the first data in the holding circuit at the time of chip reset; and
transferring, by the controller, the first data held in the holding circuit to the first power domain at a time of reset of the first power domain after the chip reset without reading the first data from the nonvolatile memory.

18. The data transfer method according to claim 17, wherein
when a first power switch coupled between the first power domain and a power-supply voltage node is switched from an off-state to an on-state, the transferring of the first data held in the holding circuit to the first power domain is performed without reading the first data from the nonvolatile memory.

19. The data transfer method according to claim 17, further comprising:
storing second data in addition to the first data in the nonvolatile memory stores;
reading, at the time of chip reset, the first data and the second data from the nonvolatile memory and writing the first data and second data into the holding circuit; and
transferring the first data written into the holding circuit to the first power domain and the second data written into the holding circuit to a second power domain while keeping the first data and the second data in the holding circuit.

* * * * *